United States Patent [19]

Kravitz

[11] 4,074,293
[45] Feb. 14, 1978

[54] HIGH VOLTAGE PN JUNCTION AND SEMICONDUCTIVE DEVICES EMPLOYING SAME

[75] Inventor: Bernard L. Kravitz, Forest Hills, N.Y.

[73] Assignee: Dionics, Inc., Westbury, N.Y.

[21] Appl. No.: 416,170

[22] Filed: Nov. 15, 1973

Related U.S. Application Data

[63] Continuation-in-part of Ser. No. 175,124, Aug. 26, 1971, abandoned, and Ser. No. 259,763, June 5, 1972, abandoned.

[51] Int. Cl.$^2$ .................................. H01L 29/72
[52] U.S. Cl. ................................. 357/34; 357/40; 357/48; 357/49; 357/50; 357/58
[58] Field of Search ........ 317/235 E, 235 F, 235 AH, 317/235 AM, 235 AG; 357/40, 58, 34, 48, 49, 50

[56] References Cited

U.S. PATENT DOCUMENTS

| | | | |
|---|---|---|---|
| 3,226,611 | 12/1965 | Haeninchen | 317/234 |
| 3,393,349 | 7/1968 | Huffman | 317/235 UX |
| 3,449,644 | 6/1969 | Nassibian | 317/235 |
| 3,507,714 | 4/1970 | New et al. | 317/235 UX |
| 3,596,149 | 7/1971 | Makimoto | 317/235 R |
| 3,729,662 | 4/1973 | Langdon | 317/235 R |
| 3,772,097 | 11/1973 | Davis | 317/235 X |
| 3,786,318 | 1/1974 | Momoi et al. | 317/235 R |
| 3,787,253 | 1/1974 | Ashar | 357/34 |

OTHER PUBLICATIONS

I. Magdo et al., "Ultra High Speed Transistor," IBM Tech. Discl. Bull., vol. 13, No. 6, Nov. 1970, pp. 1423, 1424.
H. Ghosh, "P-Epi Transistor Having a Retarded Base Region," IBM Tech. Discl. Bull., vol. 13, No. 6, Nov. 1970, p. 1740.

*Primary Examiner*—Stanley D. Miller, Jr.
*Assistant Examiner*—Joseph E. Clawson, Jr.
*Attorney, Agent, or Firm*—James J. Burke

[57] ABSTRACT

A PN junction having very low concentration gradients on both sides exhibits substantially increased breakdown voltages. A PN junction extending to the surface of a semiconductive body is formed by diffusing material of a first conductivity type into material of a second conductivity type in two stages: in the first stage, the surface concentration of impurity atoms is no higher than about $10^{16}$ per cc., and is always two to four orders of magnitude less than conventional junctions. In the second stage, the area of diffusion is smaller, so as to be surrounded by the area of said first stage diffusion, but concentration and depth are at normal levels, roughly $10^{17}$–$10^{20}$. The higher the concentration is in the second stage, the greater the concentration difference between the two stages must be. Breakdown voltages of devices employing the junction of the invention are improved: planar transistors with $BV_{cbo} = 1000$ volts may be produced. Other properties of devices employing the junction of the invention are either not affected or are improved, and employment of the junction is essentially independent of other design parameters. The junction of the invention may be used in both active and passive devices, and is adapted for use in integrated circuits and for PN junction isolation. In dielectrically isolated integrated circuitry, a further improvement is achieved by diffusing into the oxide dielectric and polycrystalline matrix material in areas that will underlie leads, effectively burying the junction in these areas.

25 Claims, 19 Drawing Figures

HIGH VOLTAGE PN JUNCTION AND SEMICONDUCTIVE DEVICES EMPLOYING SAME

RELATED APPLICATIONS

This application is a continuation-in-part of application Ser. No. 175,124 filed Aug. 26, 1971 and application Ser. No. 259,763 filed June 5, 1972 both abandoned.

BACKGROUND OF THE INVENTION

1. Field of the Invention

The present invention relates generally to semiconductors and semiconductive devices and more particularly, it relates to PN junctions in such devices which extend at least in part under a protective oxide to a top surface of the bulk semiconductive material. Such junctions are commonly referred to as "planar" junctions, and the technology employed, and the resulting semiconductive devices or circuits, are referred to as "planar". This distinguishes them from so-called "mesa" devices and circuits, wherein whole layers of alternating conductivity type materials are diffused and, by etching to form active devices, the junctions without protective oxide extend only to the edges of the bulk semiconductive material.

Planar devices have heretofore been limited to relatively low voltages because they break down due to certain surface effects at voltages very substantially below the bulk breakdown voltage (BV). Transistors and other planar devices as manufactured under this invention are not limited by such surface breakdown voltages, and are thus capable of higher voltage operation. They are more reliable under normal conditions, since they have a greater margin of safety under equivalent biasing conditions. They may be operated at higher line voltages, eliminating the need for voltage reducing equipment. Alternatively, with surface breakdown eliminated as a problem, geometry can be changed to improve frequency characteristics, or bulk resistivity can be lowered to improve saturation characteristics.

A principal application of the present invention is in the construction of planar transistors, either as discrete devices or as parts of an integrated circuit. Understanding of the invention will be facilitated by briefly reviewing typical prior art procedures for the production of such devices. For the production of an NPN transistor, the starting material will be a wafer of single crystal N-type silicon or a layer of N-type epitaxial silicon grown on a N+type silicon base. The wafer will have a bulk resistivity of several ohm-centimeters ($\Omega$-cm) and a normal N-type impurity concentration of about $10^{14} - 10^{15}$ (concentrations referred to herein, except for starting materials, are surface concentrations, in atoms/cc). After lapping and polishing, or after epitaxial layer depositions, a film of silicon dioxide ($SiO_2$) is grown on a major surface of the wafer by either low or high temperature oxidation techniques, steam being a common oxidant. For many applications, an oxide film thickness of about 6000 angstroms (A) is sufficient.

The surface geometry of the transistor - more particularly the size and configuration of the base and emitter areas - has been worked out in advance in conformity with desired properties in the finished device, and results in the generation of masks for these areas. Photolithographic techniques are employed, in conjunction with the proper mask, to deposit an etch resist on the entire oxide surface, except the desired base region. Etching through the opening in this mask removes the $SiO_2$ and exposes the underlying silicon. The wafer is now ready for the steps which will form the base region of the transistor (the body of the wafer will form the N-type collector). The first step is to deposit a controlled amount of P-type material, commonly boron, onto this exposed surface. A diffusion furnace is typically used. For very accurate control of the deposition of the P-type material, it is possible to adjust the deposited concentration by use of a wet oxidation which will serve to leach some of the boron away from the Si and into the $SiO_2$. By measuring sheet resistance after this step, the desired level of P-type impurities on the silicon surface can be more precisely reached. Other methods are also known.

The next step is to diffuse the P-type material from the surface of the silicon into the body thereof, creating a P-type base region within the N-type collector region. A diffusion furnace is employed for this purpose, and results in a collector-base PN junction being formed between the two regions. The concentration of P-type material in the base region is typically $10^{18} - 10^{19}$ atoms per cubic centimeter, and the depth of the diffusion is typically 6 microns. It will be noted that this junction extends up to the single major surface of the wafer around its entire periphery, this being the main characteristic of planar technology.

Formation of the emitter region follows, and involves similar steps. An oxide was grown over the base opening during the base drive-in diffusion and an emitter mask now defines an emitter area within the base area. The oxide in this area is removed by etching, and an N-type material, typically phosphorus, is deposited on the surface and then diffused into it. The concentration of N-type material in the emitter region is typically $10^{21}$ atoms per cc., and the depth of the diffusion is typically 4 microns.

The transistor is now complete except for making electrical contact thereto. Again, the oxide had been regrown over the emitter areas during the emitter diffusion, and yet another mask is now used to define contact areas for the base and emitter terminals. When the oxide has been etched from these areas, a metal such as aluminum is evaporated onto the surface of the wafer. Still another mask is used to cover the desired contact areas, and the metal in the uncovered areas is removed by etching. The collector contact may be on the top or bottom surface. In the latter case, it is formed by evaporating another metal, typically gold onto the bottom surface of the wafer. Normal procedures are to manufacture a large number of these devices on a slice of silicon and, after completing the steps enumerated above, cut or "dice" the slice into individual transistors.

A variety of problems are associated with the point where the lead crosses the junction. These problems are different in different devices and are not well understood, but are generally referred to as channelling, surface inversions, MOS effects and the like. In essence, the voltage in the lead and its polarity induce a change in the behavior of the junction near the surface, which of course changes the behavior of the device. The magnitude of these problems is kept within acceptable limits by spacing the base and emitter contacts sufficiently far apart, and increasing the thickness $SiO_2$ layer. Increased spacing of the base and emitter, however, requires that the chip itself be larger. This is undesirable since the larger the chip, the fewer chips will be produced per wafer.

The present invention overcomes the lead-over-junction problems in dielectrically isolated semiconductive devices having high-voltage junctions of the above-noted type. Dielectric isolation is a well known technique familiar to those skilled in the art. Briefly, separate discrete devices are produced from a single wafer and are separated from each other by dielectric material, generally SiO$_2$, and are retained in a matrix of polycrystalline silicon or even glass. To produce such devices, a slice of single crystal silicon is first grooved in a desired pattern to a desired depth to define discrete device areas on each chip. SiO$_2$ is grown on the entire surface. Polycrystalline silicon is then epitaxially grown on the SiO$_2$. The slice is then turned over, and the single crystal surface is lapped down until the grooves cut in the other side appear. The resulting slice comprises a plurality of "tubs" of single crystal silicon, each entirely surrounded by a layer of SiO$_2$ and set in a matrix of polycrystalline silicon. Depending on groove geometry, the tubs may be isolated on the surface by just SiO$_2$ or SiO$_2$ and polycrystalline material. Active devices are assembled in the silicon "tubs" and leads are evaporated onto the surface. The polycrystalline surface may be lapped or etched away to expose the tub bottoms for collector electrode attachment, or the collector lead may be on the top surface.

Dielectrically isolated devices may employ the high-voltage double diffusion type junctions referred to hereinabove and they will, ordinarily, be subject to the same lead-over-junction problems that conventional planar devices and circuits suffer from.

Before considering the efforts of prior workers to raise the voltage characteristics of planar devices, the applicable parts of the operation of a conventional planar transistor should be considered, and attention is directed to FIG. 1. This is a typical transistor structure as could be produced by the above-enumerated processing steps. Regions of different conductivity type are labelled (it is to be understood that NPN and PNP structures are substantially equivalent in operation, and either may be employed). Thus the transistor 10 of FIG. 1 comprises an N-type collector region 12, a P-type base 14 and an N-type emitter 16, collector-base junction 18 and emitter-base junction 20 defining the various regions. A layer of SiO$_2$ 22 covers the surface of the device except for the base contact 24 and the emitter contact 26, both of which are typically evaporated aluminum. A gold collector contact 28 is evaporated onto the bottom surface. For clarity the SiO$_2$ layer 22 is shown as being of uniform thickness but, because of the various re-growing and etching steps it actually has a stepped appearance. The SiO$_2$ layer 22 is commonly referred to as a passivation layer, because it protects the sensitive PN junctions and passivates them against the harmful effects of moisture and surface contaminants.

It is known that the maximum electric field for a particular voltage on a PN junction increases as the doping on either or both sides is increased; while in general the breakdown voltage of a junction depends on the bulk resistivity of the lightly doped side, junctions heavily doped on both sides are known to generate a substantial peak field even at modest applied voltages, since the space charge will spread in relation to the concentration on both sides. The main characteristic of an electric field is, of course, that it accelerates charge carriers (electrons or holes). As the reverse voltage across a junction increases the electric field increases and the carriers are accelerated more and more, until a point is reached where a single carrier colliding with a silicon atom causes a pair of carriers to be released. This pair itself is accelerated and the process of carrier generation continues until it results in avalanche breakdown of the junction. It is believed that the magnitude of the field and the distance over which it obtains are the main factors influencing the voltage at which avalanche breakdown will occur. It is clear, however, that lightly doped, high resistivity junctions create less of a field than heavily doped junctions, and are to be preferred in any high voltage device. Thus, typical high voltage devices are diffused into high resistivity silicon, even though they have other voltage-limiting problems.

Each junction 18, 20 in transistor 10 has its own associated BV. The voltage across the collector-base junction 18, with the emitter open, $BV_{cbo}$, and the voltage from collector-to-emitter with the base open, $BV_{ceo}$ are important ones; breakdown across the base-emitter junction ($BV_{ebo}$) invariably occurs at a lower level due primarily to the much heavier doping level in the base.

A factor that may be significant in affecting surface breakdown voltage is the behavior of doping atoms during various oxide growing steps inherent in the manufacturing process. Since surface boron incorporates more readily into SiO$_2$ than into silicon, under oxide-growing conditions some boron is "leached" from the silicon surface into the growing oxide. Conversely, phosphorus segregates more readily into elemental silicon than into the growing oxide, so that as the oxide grows, phosphorus accumulates on the silicon side of the interface, the so-called "snowplow" effect. Thus the segregation coefficient to the impurity between the oxide and the silicon, and the time and temperature of the oxidation, all work to redistribute the impurities in the vicinity of the surface, modifying the bulk resistivity at the surface. The effect thereof under conditions of reverse bias may well be the creation of a lower voltage junction, collector to base, which breaks down at a much lower voltage than the bulk material would indicate.

The BV of a device can, of course, be increased by using a starting material having a higher bulk resistivity, but this is often to the detriment of other important parameters, such as frequency response and saturation level. As a result, the bulk of the effort to increase BV in silicon planar devices has been concentrated in the area of changing the surface characteristics of the material near the collector-base junction, in effect trying to block channels with so-called "guard rings" or "field relief rings". Some of these efforts are discussed below.

2. Prior Art

The foregoing is all well known to those skilled in the art and is presented herein in summary form only to provide the necessary basis for understanding of the present invention. A more detailed treatment of the subjects discussed may be found in many standard texts, such as Warner and Fodemwalt (Editors), *Integrated Circuits*, Motorola, Inc. Semiconductor Products Div. (1965). The particular problems associated with junctions under SiO$_2$ films are treated by Atalla et al, *Impurity Redistribution and Junction Formation in Silicon by Thermal Oxidation*, Bell Systems Technical Journal, July 1960.

It is generally agreed that at the interface between a semiconductive body and the overlying oxide film, charges may be present or may be formed, which charges can move under the influence of an electric field. This is referred to as a surface charge. As a result of the presence of such surface charges, so-called "inversion layer" may be formed on the semiconductor surface below the insulating oxide. The inversion layer has a conductivity type opposite to the conductivity type of the underlying semiconductive material. It is believed that such an inversion layer not only reduces breakdown voltages but also, because it effectively increases PN junction surface area, increases capacitance, which is particularly undesirable in high frequency devices.

To remove or reduce these surface charges and inversion layers, a field relief ring may be employed. This is an annular metal layer placed over the insulating oxide layer at the area of the PN junction, which layer is connected to a reference potential (usually one side of the junction). Problems associated with field relief rings are that the rings should be fully enclosed, and they must be insulated from overlying conductives U.S. Pat. No. 3,491,273 of Stiegler discloses a field relief electrode.

A guard ring is a different approach to solving the same problem. A guard ring is in the semiconductive material and extends to the surface, but is spaced at a distance from the PN junction. The guard ring is generally of the same conductivity type as the underlying material, but has a significantly higher charge carrier concentration. Thus, if the bulk material is P-type, the guard ring would be designated P+. The concentration of charge carriers in the guard ring is sufficiently high so that an inversion layer on one side or the other thereof is interrupted. Drawbacks to this type of structure include the fact that they consume a lot of area, since if they are too close to the junction a low breakdown voltage (between the base material and the ring) will result. This is undesirable, particularly in integrated circuits.

Haenichen, U.S. Pat. No. 3,226,614 (1965) is typical of many patents in this area. Briefly, the base region is extended in a thin surface region having a higher resistivity than the bulk material on the base, thereby encouraging breakdown in the bulk rather than the surface. This intentional channel terminates in a ring of low resistivity material of the opposite conductivity type. This is alleged to prevent breakdown through induced channels. However, no figures are given on what $BV_{cbo}$ is achieved with this geometry.

In Tremere, U.S. Pat. No. 3,338,758 (1967) a PNP device is disclosed wherein a lightly doped out-diffused (P−) layer is provided across the entire surface, and a ring of P+ material is diffused around the N-type base, spaced therefrom by less than $2\mu$. This is alleged to produce a surface gradient protected high breakdown junction but, again, no $BV_{cbo}$ figures are given.

A more recent patent discloses in one instance the raising of the "effective" breakdown voltage of a silicon planar diode from 600 to 1100 volts, by the interposition of a ring containing "substitutionally active ions in interstitial positions." Martin et al, U.S. Pat. No. 3,515,956 (1970) employs ion implantation means to dope a very high resistance (9,000–11,000Ω-cm) N-type starting material. It is noted that any device employing such material could theoretically be expected to have a BV of thousands of volts. Such material is never used in conventional devices, however, because of the deleterious effect on other parameters. But the device disclosed by the patentee is by no means conventional, including as it does a junction ½ inch in diameter. The passivated device is first provided with the ½ inch P-type region of 0.01Ω-cm and then an even wider area is irradiated with 100 kilovolt boron ions to implant $10^{12}$ ions per $cm^2$. Annealing follows. In one instance cited leakage current is reduced while BV is unaffected and in another case BV is raised to 1100 volts but leakage current is not affected. The former is attributed to an inversion layer and the latter to an accumulation layer, but why two different results are produced by the same process is not disclosed. The leakage currents reported are in the microampere range, some 3-4 orders of magnitude larger than can be tolerated in conventional devices, where such currents are normally measured in nanoamperes.

In considering this patent, it is to be noted that ion implantation produces interstitial impurities (i.e. impurities located within the crystal lattice between lattice sites), whereas diffusion produces substitutional impurities (i.e. impurities occupying lattice sites). Any interstitial atoms inherently strain a lattice, and lattice strain inherently increases leakage currents. Thus, the second irradiation mentioned at a lower level than the first, would appear to ameliorate the problems created by the first, in producing a gradually strained instead of a sharply strained lattice. Further, it is apparent that this treatment merely increases the resistance of the material, resulting in the same leakage current at a higher but still disappointing voltage, since BV for 9–11,000Ω/cm N-type material should be several thousand volts.

While the present invention is concerned with planar rather than mesa technology, the patent of Blicher et al, U.S. Pat. No. 3,427,515 is of interest because of the concept of the symmetrical junction described therein. In particular, it is pointed out that in prior art high-voltage transistors the collector-base junction includes a collector region of very low impurity concentration and corresponding high resistivity, and a diffused base of high impurity concentration, so the junction is very abrupt. This produces a high electric field under conditions of reverse bias, and the junction breaks down readily. The patentees teach the formation by epitaxial rather than diffusion techniques of sub-regions of the junction, these base and collector regions having the same thickness and preferably the same concentration (a factor of 3 being the limit for concentration differences). This symmetrical junction exhibits a 50% lower field strength for a given reverse voltage, and the breakdown voltage is thus effectively doubled. As described by Blicher et al, the method is not applicable to planar devices.

British U.S. Pat. No. 1,153,495 of Lamming (1969) discloses a double-diffused base region adapted to overcome the so-called "base push-out" or "emitter dip" effect. Specifically, during emitter diffusion the collector-base junction is pushed farther into the collector region in the area below the emitter. This can give rise to poor electrical characteristics, particularly in high frequency planar transistors, where very narrow base widths are required. Starting with N-type silicon of $2 \times 10^{15}$ donor concentration, the patentee first diffuses boron to a surface concentration of $2 \times 10^{18}$ over a wide area which forms the junction at its periphery, and then diffuses boron over a smaller area to a surface concentration of $10^{20}$, the smaller area being surrounded by the larger area. Emitter diffusion follows, and has the effect of driving the second base zone into the first base zone below the emitter, but does not move the locus of the junction formed by the first zone. The patentee does not comment on $BV'_{cbo}$, but there are two reasons why this would be the same or lower than in conventional devices. At the high base impurity concentration disclosed ($10^{20}$), it is necessary that the lower concentration zone be at least four orders of magnitude less for increased breakdown voltages to be observed. Further, in the area below the emitter where the second zone is disclosed as reaching the original junction, there will be a very steep concentration gradient, and this tends to lower $BV_{cbo}$.

The recent patent of Davidsohn, U.S. Pat. No. 3,716,425 (1973), is also of interest in disclosing simplified diffusion masks which include adjacent tubs of single crystal silicon and the dielectric and matrix material therebetween.

While most of the prior art patents are devoid of actual figures for $BV_{cbo}$ under defined conditions, it is believed that highest voltage planar devices currently available are rated at about 300–400 volts, and such devices are sufficiently expensive to make their use uneconomical, except in military and space application.

OBJECT OF THE INVENTION

It is a general object of the present invention to provide a planar, diffused PN junction having a breakdown voltage approaching, or equal to, the bulk breakdown voltage of the material.

Another object of the invention is to provide diffused, planar semiconductive devices having breakdown voltages approaching or equal to the bulk breakdown voltage of the material.

A further object of the invention is to provide diffused, planar semiconductive devices having high breakdown voltages and wherein other device parameters are not adversely effected.

Still another object of the invention is to provide a planar, diffused PN junction of high breakdown voltage which is useful in making high voltage diodes, resistors, transistors and integrated circuits.

Another object of the present invention is to provide planar, dielectrically isolated semiconductive devices having high voltage PN junctions wherein the lead-over-junction problems are substantially reduced or eliminated.

A still further object of the present invention is to provide planar, dielectrically isolated semiconductive devices, having high voltage PN junctions, which devices are smaller than similar devices heretofore available.

Various other objects and advantages of the invention will become clear from the following description of embodiments thereof, and the novel features will be particularly pointed out in connection with the appended claims.

THE DRAWINGS

Reference will herein be made to the accompanying drawings wherein.

Figure 1:
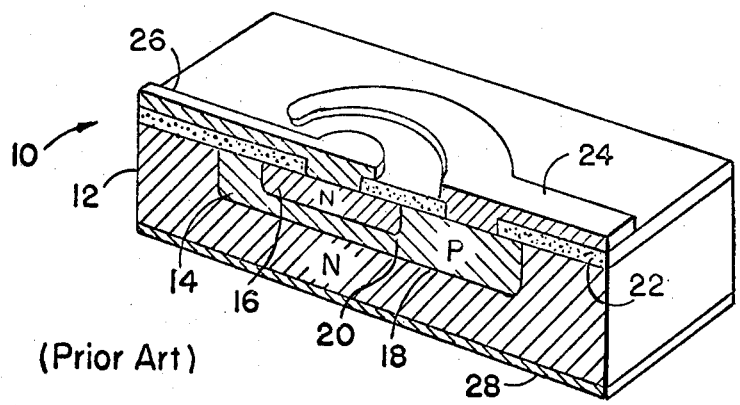
FIG. 1 is a perspective view, in section, of a typical prior art planar diffused transistor.

It is to be understood that the drawings of parts are simplified schematic views which are greatly out of scale to better illustrate the best mode of carrying out the invention.

SUMMARY OF THE INVENTION

In essence, the foregoing objects are achieved by providing a planar PN junction with a low concentration gradient on both sides thereof. This is accomplished by diffusing the starting material in two stages: the first stage is from 0.5 mil to 1 mil greater in radius than the second stage, and may be the same depth but is preferably of greater depth than the second stage. The average impurity concentration in the first stage is two to four orders of magnitude less than the concentration thereof in the second stage, and is generally no higher than $10^{16}$ atoms/cc. The second stage is the normal base diffusion which, depending on the device design, will have an impurity concentration from low ($10^{17}$) to high ($10^{20}$). In the former case, the first stage diffusion would be to no more than $10^{15}$, or two orders of magnitude difference, and in the latter case the limit would be $10^{16}$, or four orders of magnitude difference. The end in view is to produce a junction having low concentration gradients on both sides, it being here assumed that the starting material is of nominal bulk resistivity (30–100$\Omega$-cm) established with an opposite conductivity impurity of about $10^{14}$.

In transistor manufacture, the second stage diffusion referenced here is a conventional base region, and collector and emitter regions are conventional in every respect, as are the $SiO_2$ passivating layer and the metallic contact pads. Thus, a transistor in accordance with the invention is made by employing all of the conventional steps, plus an additional base diffusion, slightly larger in area and considerably less concentrated in impurities, than the conventional base. The same concept is employed to increase the breakdown voltage of an integrated circuit resistor, a diode and a pair of PN junctions used for electrical isolation. Using the same double diffusion technique on the base region, a deeply diffused emitter may be provided to produce a transistor with a correspondingly narrowed base and increased frequency response while still retaining higher voltage characteristics than normal. Further, this technique can be employed with lower-than-normal bulk resistivity starting materials, with the production of devices having normal breakdown voltages but better saturation characteristics.

When applied to dielectrically-isolated (or DI) integrated circuitry, the present invention can also overcome the above-mentioned lead-over-juncton problems if the added diffusion step is carried out in an area that extends to or beyond the boundary of the device, at least in such areas as underlie the leads which cause the problem. In effect, this buries the junction underlying the lead on the edge of the device and keeps it away from the surface. As a practical matter, it is desirable to extend the diffusion zone a short distance into the surrounding SiO₂ or polycrystalline material, because of mask tolerances in DI processing techniques. So, if the mask is cut to allow diffusion into the polycrystalline silicon of 0.5 mil or more, one is assured that the diffused zone will cover the desired areas. While the SiO₂ is subjected to diffusion, the extent that dopant actually is diffused into it is small, and unsufficient to change its dielectric properties.

With conventional construction, the collector contact on a transistor (or the cathode on a diode) must be spaced from the junction a sufficient distance so that the spreading of the space charge from the junction does not affect operation. With the present invention, wherein the high voltage diffusion zone extends to the edge of the SiO₂ tub, the space charge can spread down but not out, and contacts can be closer and the overall size of the chips reduced. For example, a conventional transistor that required a 40 by 80 mil chip was redesigned employing the diffusion zone of the present invention on a 30 by 51 mil chip. This reduction in device size permits almost twice as many chips to be produced on a wafer, and a much better yield, in terms of devices-per-wafer, is achieved.

DESCRIPTION OF EMBODIMENTS

Figure 2:
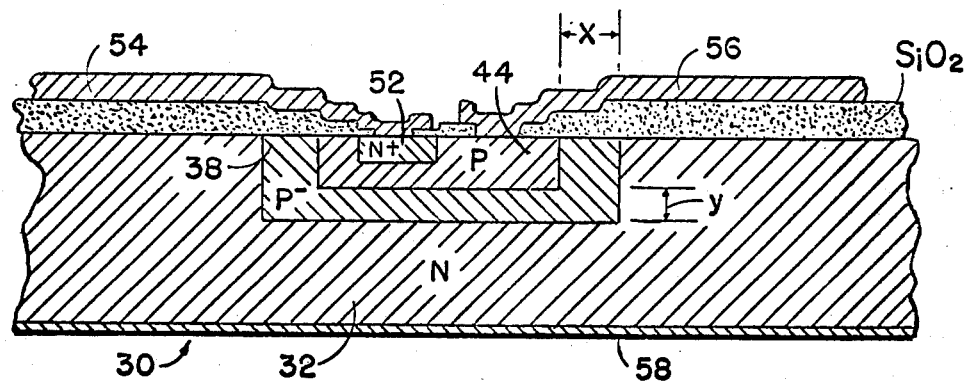
FIG. 2 is an elevation, in section, of a transistor in accordance with the present invention.
Figure 4:
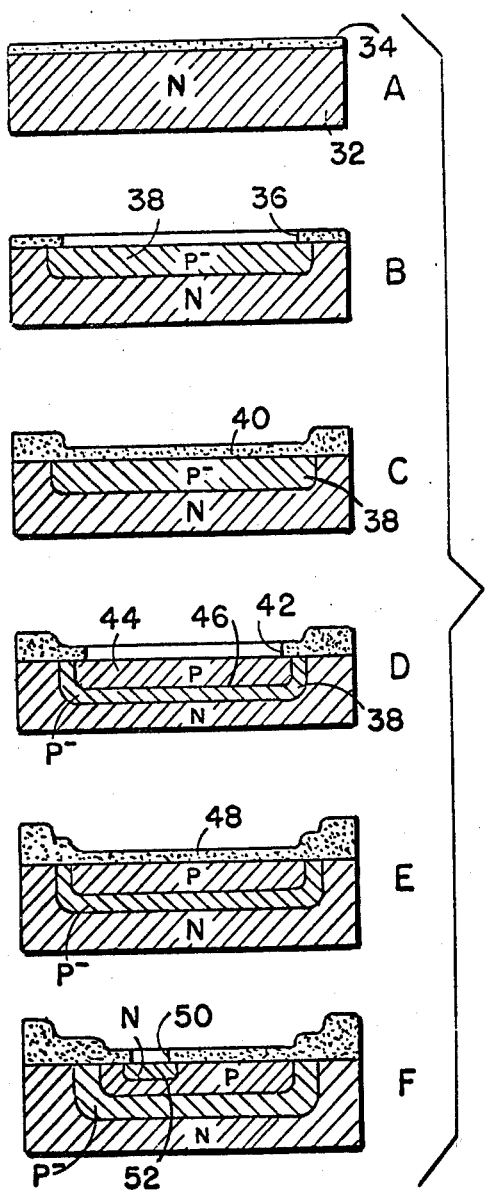
FIGS. 4A–4F illustrate the steps involved in producing the structure of FIG. 2.

Referring now to FIG. 2, a diffused planar transistor 30 of the NPN type is shown. Referring to FIG. 4A, N-type starting material 32, a slice of single crystal silicon having a bulk resistivity of 30–100Ω-cm, is employed (it is to be understood that FIG. 2 and FIGS. 4A–4F show a single device, but that several thousand identical devices are produced in a single slice simultaneously). Preparation of the slice is conventional: it must be lapped and polished unless it is epitaxial silicon. In the latter case, it is noted that the epitaxial layer must be sufficiently thick to support the intended voltage. The wafer is then oxidized by either low or high temperature oxidation techniques to provide an SiO₂ layer 34 on one surface. Again, the thickness of layer 34 must be sufficient to support the intended voltage. About 12,000 Å is required in many instances where 6,000 Å would be sufficient on a conventional low voltage device. After the layer 34 is grown the first diffusion mask is employed to cut an opening 36 in layer 34 and deposit a P-type material such as boron onto the surface and diffuse it into P- base region 38 (FIG. 4B). This may be termed the high voltage diffusion.

The geometry of opening 38 depends largely on the conventional base region 44 (FIG. 2) that is being made into a high voltage device. First, it is to be noted that while square geometry may be employed, round is preferred since there are no corners to act as electric field concentration points. The size of opening 36 will, of course, determine the size of region 38. From the standpoint of material economy, it is desirable that $x$, the difference in radii between the high-voltage region 38 and conventional base region 44 be as small as possible. This may be termed the lateral field distance. However, the limits of resolution of current photolithographic techniques make a value of $x$ of less than 0.2 mil questionable in terms of reproducibility. For maximum BV, on the other hand, $x$ should be large. It has been found, however, that for values of $x$ greater than 1 mil the degree of improvement in BV is small compared to the "cost" of using significantly more material. Thus, for practical devices of substantially conventional geometry, values of $x$ from about 0.5 mil to about 1.0 mil are preferred.

In the deposition and diffusion of the P-type material into region 38, the depth and average concentration of impurities are important, but the means by which they are achieved is not critical. A typical deposition of boron may involve treatment at 920° C for 15 minutes in a flow of nitrogen-diluted diborane. Then, in a second furnace, oxidation in steam is carried out while including a sample for later measuring sheet resistance to achieve the exact surface concentration of desired boron (as noted hereinabove, boron tends to be leached from the silicon into the oxide due to differential diffusion and segregation coefficients). The boron is then driven into the surface in a diffusion furnace by heating, typically at 1150° C for a period of 15 hours in an atmosphere of nitrogen. Typical results are a diffusion depth of 5 microns and an average concentration of $10^{16}$ B atoms/cc. Of course, the actual concentration varies over many orders of magnitude with distance from the surface, in accordance with the diffusion laws; this discussed hereinbelow in connection with FIG. 3.

During the oxidation and diffusion steps the oxide regrows 40 (FIG. 4C) over opening 36. The second mask is now employed to etch another opening 42 (FIG. 4D) in oxide 40 corresponding to the conventional base region, and depositing and diffusing additional boron therein to form base region 44. Techniques may be the same as described above, but controlled to produce the higher desired concentration and (as shown in FIG. 2 and FIGS. 4D–4F) a lesser depth. Generally the difference in depth ($y$ in FIG. 2) between the high voltage region 38 and the conventional base 44 will be small, (as shown) but it may also be a zero or a negative value under certain circumstances, as set forth more fully below. It is important to note that the line identified as 46 between regions 38 and 44 in FIG. 4D is not a PN junction, but rather defines the P-P⁻ boundary or transition zone between areas of different concentration but similar conductivity type.

During the oxidation and diffusion used to produce base 44, oxide 48 regrows over the base opening 42 (FIG. 4E). Following the same procedures as outlined before, an emitter mask is used to etch another opening 50, and N-type material such as phosphorus is deposited and diffused to form emitter region 52. With the addition of an emitter pad 54, a base pad 56 and a collector pad 58 (FIG. 2) the device is complete.

Figure 3:
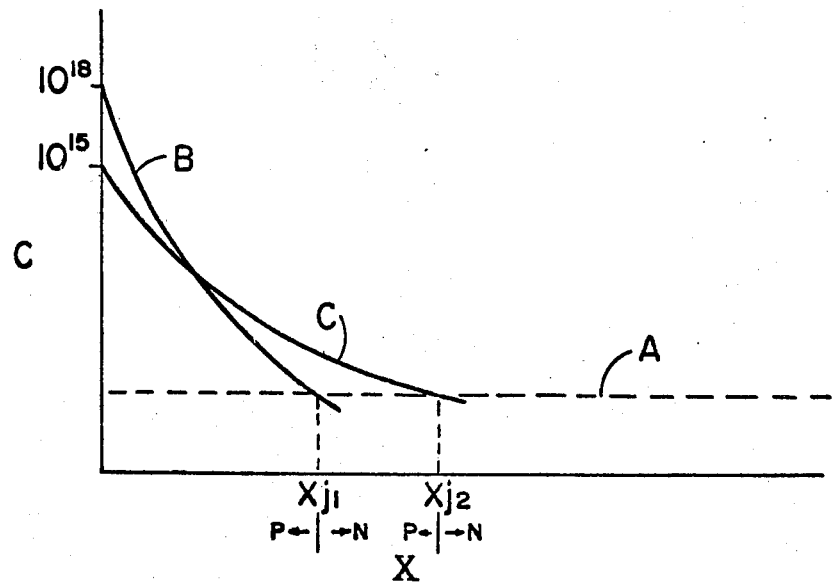
FIG. 3 is a plot of diffusion curves (distance from surface vs. impurity concentration) for conventional collector base junctions and said junctions manufactured in accordance with the present invention.

The mechanism by which devices produced in accordance with the present invention achieve a BV approaching or equal to the breakdown voltage of the material can only be theorized and the following comments are believed to be relevant. Attention is directed to FIG. 3, which is a plot of impurity concentration (C) versus distance from the surface (X) after the diffusion step. The dotted line A represents the impurity level in the bulk material (phosphorus for the N-type material described hereinabove). Curve B corresponds to a conventional base diffusion, with an average surface impurity level of $10^{18}$ boron atoms per cc. Concentration drops with distance from the surface until curve B crosses line A; this is the point $x_{j1}$ where the conventional PN junction is formed, because on one side thereof P-type impurities predominate, and on the other side N-type impurities are in the majority. Curve C represents the high voltage diffusion step of the present invention. It is to be noted that the additive effect of the two diffusions is minimal in the heavily doped region because of the very low level (three orders of magnitude less) of the first diffusion. For example, if the second diffusion is at a level of $5 \times 10^{18}$ and the first is $1 \times 10^{15}$, the highest concentration possible would be $5.001 \times 10^{18}$. Thus, the high voltage diffusion does not materially effect the properties of the base region in the high concentration areas. Curve C starting with a surface concentration of $10^{15}$ intersects line A considerably farther into the material than Curve B, although this is not at all a necessity. More important, it is believed, the slope of Curve C is much less at the point $x_{j2}$ than the slope of Curve B at $x_{j1}$. Thus, the impurity concentration in the vicinity of the junction is much more gradually changing than is the case in a conventional junction. It is felt that this very gradual change from N to P type conductivity is at least partly responsible for the high voltage characteristics of junctions manufactured in accordance with the present invention. It, at least, appears to be consistent with the theory that a junction lightly doped on both sides creates less of a peak field at a given reverse bias than a heavily doped junction. Further, it is compatible with standard planar technology and results in oxide-passivated junctions.

Figure 5:
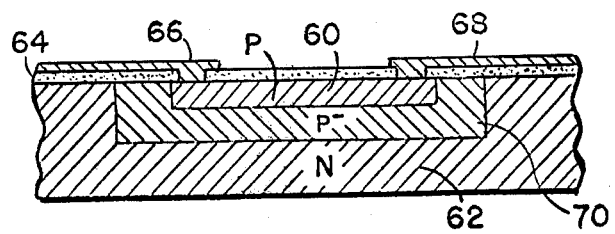
FIG. 5 is a sectional elevation of an integrated circuit resistor in accordance with the invention; isolation structure has been left out for clarity.
Figure 6:
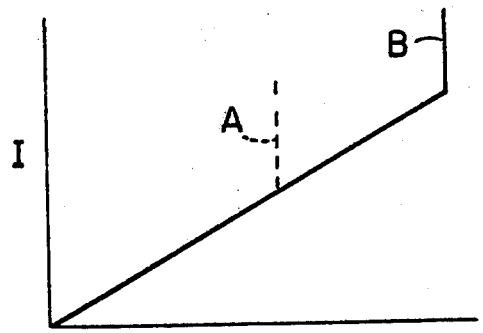
FIG. 6 is a plot of current vs. voltage for conventional resistors and the resistor of FIG. 5.

FIG. 5 shows an integrated circuit resistor manufactured in accordance with the present invention. A conventional resistor of this type would include a heavily doped P region 60 in the bulk N material of the integrated circuit. A layer of oxide 64 insulates a pair of conductors 66, 68 connected to either end of P-type region 60. Such a resistor would have current-voltage characteristics shown by Curve A in FIG. 6. By diffusion of a P$^-$ zone 70, of two to four orders of magnitude lower concentration than region 60, breakdwon is raised to the level shown in Curve B of FIG. 6. The lighter doping inherent in the P$^-$ zone has little or no affect on resistor value.

Figure 7:
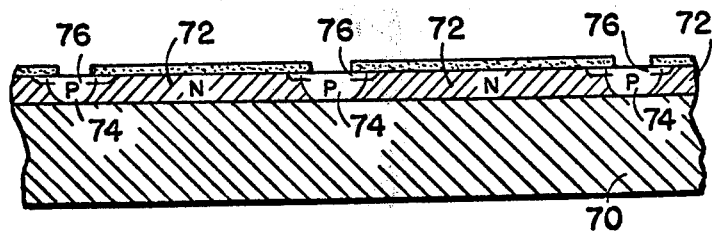
FIG. 7 is a simplified, sectional elevation of a portion of an integrated circuit illustrating PN junction high voltage isolation in accordance with the invention.

The use of PN junction isolation is a common expedient in the manufacture of integrated circuits. A pair of junctions, back-to-back, is employed to isolate active devices, each junction forming the "edge" of one of the devices. FIG. 7 shows such an arrangement in simplified form: Epitaxial N-type silicon is deposited on a P-type substrate 70, and active device regions 72 are formed by diffusion of P-type material 74 therebetween. By first applying a high-voltage diffusion in accordance with the present invention, the P$^-$ regions 76 are formed, increasing the insulating capacity of each pair of junctions substantially.

It should be appreciated that the method of the invention is applicable to raising the voltage characteristic of an entire slice of integrated circuits, with the single additional operation of a high-voltage diffusion. Thus, an additional mask is required and defines the areas for high-voltage diffusion for transistors, diodes and resistors. A single deposition-diffusion cycle establishes the high voltage junctions for all devices on the slice.

As set forth hereinabove, the high-voltage diffusion of the invention is carried out prior to the normal diffusion. This procedure can be reversed providing that account is taken of the fact that diffusion of a previously-established region continues during a subsequent diffusion. A normal base region will expand during a subsequent high voltage diffusion, just as a high voltage region will diffuse further during a subsequent normal base diffusion. Mask geometry and diffusion cycles must thus be corrected so as to achieve the proper impurity concentrations and depths. The two steps may be considered interchangeable with this qualification.

Figure 8:
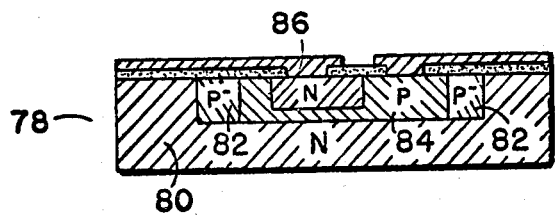
FIG. 8 is a schematic sectional elevation of a high-frequency, narrow base transistor in accordance with the invention.

With the capability for high voltage planar diffused junctions established, it will be appreciated that in some instances it will be desired to sacrifice the higher breakdown voltage in favor of improving some other device parameter. A very simple example of this is to use a starting material of lower bulk resistivity. Employing the invention in this situation will maintain BV at the previous normal level but will improve the saturation characteristics. Another example is the high-frequency transistor 78 shown in FIG. 8. This comprises an N-type collector region 80, a P$^-$ high-voltage region 82, a normal base region 84 the same depth as region 82 (i.e. $y = 0$) and a relatively deeply diffused emitter 86. The latter provides a very narrow base width, thus improving the alpha cut-off frequency, while maintaining BV$_{cbo}$ and BV$_{ceo}$ at the conventional level. Normally, narrowing the base-width to a similar value would result in an undesirably low BV$_{ceo}$. It will be noted that the concentration gradients at the junction between regions 80 and 84 will be steeper on the base side, which will tend to lower BV$_{cbo}$.

While it has been stated that processing in other than the high-voltage diffusion is conventional, it will be appreciated that certain changes are necessary to produce a high-voltage device. In particular, the thickness of the passivating layer of $SiO_2$ must be sufficient to handle the higher voltage. Similarly, the size, thickness and separation of the contact pads must be sufficient for the high voltage.

Figure 9:
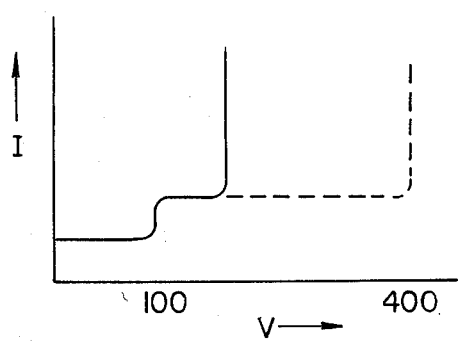
FIG. 9 is a voltage-current plot for conventional transistor junctions and transistor junctions made in accordance with the present invention.
Figure 10:
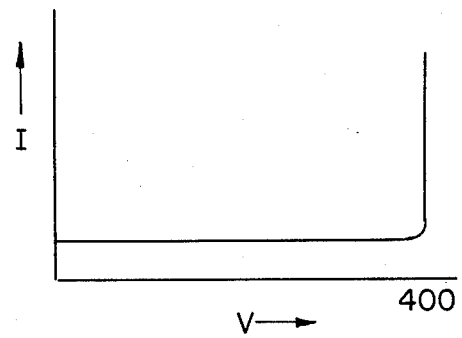
FIG. 10 is a voltage-current plot for a junction in a transistor made in accordance with the present invention.

Understanding of the invention will be further facilitated by referring to FIGS. 9 and 10, which are both voltage-current curves for a junction in a transistor. FIG. 9 has a solidline curve for a transistor having a breakdown voltage of about 200 volts. It will be noted that there is a rise in the leakage current at about 100 volts, which is of course undesirable. It is believed that this rise in leakage current is due to one of the aformentioned surface phenomena caused by current in the lead effecting behavior of the junction at the cross-over point. A similar transistor with a double-diffused base region will exhibit an increased breakdown voltage, up to about 400 volts as shown by the dotted line in FIG. 9. However, the increase in leakage current at about 100 volts is essentially unchanged, compared to the transistor not so treated. If a similar transistor is designed with the high-voltage diffusion zone extending to the side of the device in those areas underlying the appropriate leads, however, the voltage-current curve shows no increase in leakage current in the entire operating range (i.e. up to 400 volts), as shown in FIG. 10.

In applying the invention to the production of high-voltage integrated circuits, it is advantageous to utilize the technique known as dielectric isolation, since structures employing this type of isolation inherently possess a much higher voltage capability than circuits using PN junction isolation. A dielectrically isolated integrated circuit comprises a plurality of single crystal silicon "cups" or "tubs" embedded in a polycrystalline silicon matrix, each tub having an oxide coating between the embedded surfaces and the matrix material. High voltage active and passive devices are fabricated in the tubs as hereinabove described, with suitable interconnections forming the complete circuit. The invention is not used in the isolating function on such devices, since PN junctions are not involved.

Thus, with DI chips, the geometry of the mask used in the high-voltage diffusion step is changed so that the area of diffusion extends to or through the sides of the device in those areas underlying the leads. In practice, the mask is generally enlarged to cover an even greater area, because imprecision in manufacturing would be likely to reduce yield if the enlarged area extended only under the leads. Further, on many chips the neighboring chips on the wafer are usually symmetrically arranged, and in these circumstances it is possible to carry out the high voltage diffusion on a large number of devices simultaneously through a single slit-type mask opening covering a large number of devices or chips. Such a mask is considerably more economical than one with a separate opening for each diffusion zone.

Figure 11:
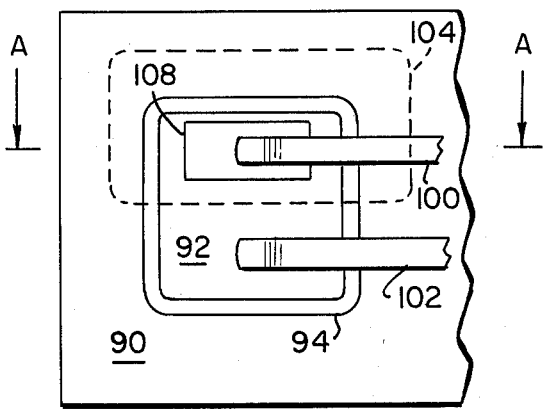
FIG. 11 is a plan view schematically showing a dielectrically-isolated diode made in accordance with the present invention.
Figure 12:
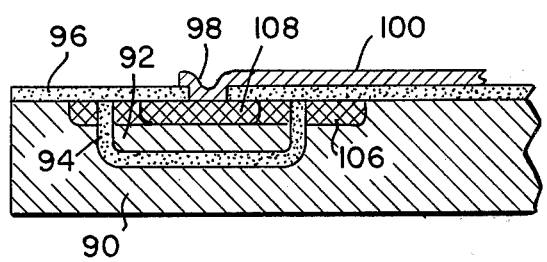
FIG. 12 is a cross-sectional elevation taken along line A—A of FIG. 11.

FIGS. 11 and 12 are top and cross-sectional views, respectively, of a diode constructed in accordance with the present invention. A dielectrically isolated slice is produced in accordance with conventional and well-known techniques which have been summarized hereinabove. The result is a matrix of polycrystalline silicon 90 containing a plurality of single crystal silicon "tubs" 92, (one shown) each separated from the polycrystalline material by a layer of $SiO_2$ 94. A layer of $SiO_2$ 96 also covers the entire top surface of the chip except where openings 98 have been etched for the attachment of anode and cathode leads, 100 and 102 respectively. In the manufacture of the device of FIGS. 11 and 12, the first diffusion step is carried out by etching an opening in the overlying $SiO_2$, through a suitable mask, in the outline indicated by dotted line 104 in FIG. 11. It will be seen that this opening extends beyond the $SiO_2$ and into the polycrystalline matrix on three sides of the device 12. It is believed to be desirable to keep the junction away from the surface whereever possible. As noted above, making the opening generally larger increases yield. Presuming that the tub 92 is N-type material, a P-type impurity is diffused through opening 104 to form a $P^-$ zone 106 (FIG. 12), the minus sign indicating a less-than normal concentration of P-type impurity atoms, generally two to four orders of magnitude lower than the conventional concentration, and no higher than about $10^{16}$.

After the initial diffusion described above, further processing is conventional: the surface oxide is regrown, a new opening is etched therein through a conventional mask and diffused to form a P-type region 108 of normal concentration, the oxide is regrown and etched for the lead openings 98, and leads are evaporated onto the surface through a final mask (more commonly, aluminum is evaporated onto the overall surface and the leads are patterned by etching through a mask). The wafer is then diced into individual chips for further processing.

Figure 13:
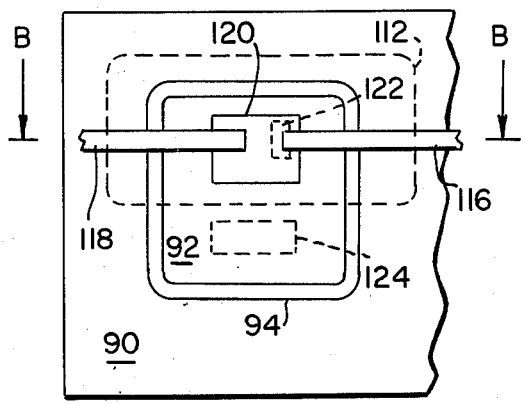
FIG. 13 is a plan view schematically showing a dielectrically-isolated transistor made in accordance with the present invention.
Figure 14:
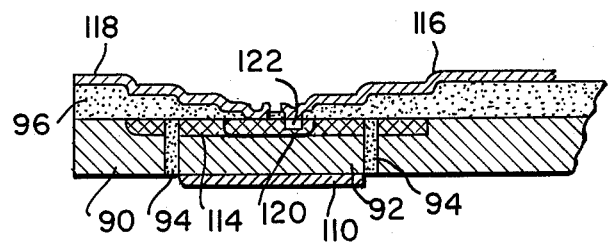
FIG. 14 is a cross-sectional elevation taken along line B—B of FIG. 13.

Construction of a dielectrically isolated transistor in accordance with the present invention is illustrated in FIGS. 13 and 14. The starting materials may be the same as previously described, but of course the geometry will be different, i.e., a polycrystalline silicon matrix 90 having tubs 92 of single crystal silicon embedded therein and insulated from the matrix and neighboring devices by a layer of $SiO_2$ 94. The $SiO_2$ across the bottom of a tub may be lapped away for attachment of a collector electrode 110, as seen in FIG. 14, but much more commonly the collector will also be on the top surface, as seen at 124 in FIG. 13.

As in the previously described embodiment, it is preferred that the high-voltage diffusion step be the first (this is so because by diffusing through successively smaller mask openings, a "step" pattern is introduced in the regrown oxide covering layer 96, as shown in FIG. 14. The high-voltage base diffusion zone is shown in dotted outline 112 in FIG. 13, and results in a diffused zone 114 (FIG. 14) extending into the matrix material under both the emitter and base leads, 116 and 118 respectively. The collector-base junction thus terminates on the edge of the device and does not extend to the surface, except on one edge remote from the leads. The impurity level of the diffusion is the same as previously described.

A conventional base region 120 and a conventional emitter 122 are diffused following known procedures, and leads 116, 118 are evaporated onto oxide surface 96.

Relative impurity concentrations in the device may be explained as follows, presuming the basic silicon 92 to be N-type. Emitter 122 will be $N^+$, base 120 will be $P^-$, and beyond the boundary of the device zone 34 will be $P^-$ to the extent that it is in fact diffused. If it is desired to have the collector contact on the top surface of the device, an $N^+$ zone 124 may be diffused therein, as shown in dotted line in FIG. 13.

The present invention is also applicable to devices incorporated into air-isolated monolithic circuits. More particularly, the present invention may be applied with good results in the method for producing air-isolated circuits described in my U.S. Pat. No. 3,559,283 issued Feb. 2, 1971 and in U.S. Pat. No. 3,680,205 issued Aug. 1, 1972, both assigned to the same assignee as the instant application. In these cases, the techniques of dielectric isolation are employed to increase yields and reduce costs, with an etch step removing the polycrystalline matrix material to produce air-isolated circuits covered with $SiO_2$.

It has been stated hereinabove and it is well recognized in the industry that conductivity types are interchangeable, i.e. that a PNP device is the full equivalent of an NPN device of the same geometry, dopant levels, etc. Nevertheless, in terms of cost, availability and general degree of commercial usage, NPN devices have been favored, it is believed because of manufacturing difficulties and reliability problems with PNP devices. The present invention has the same effect on PNP devices as it does on NPN devices; raising of the voltage characteristics makes the other problems of PNP construction more tractable, however, and it is felt that the invention may find even broader application in this area.

EXAMPLES

A 2N918 transistor typically has $BV_{cbo} = 18$ volts. When treated with a high voltage diffusion in accordance with the invention ($x = 0.5$ mils, $C = 10^{15}$ B atoms/cc and a depth of 2 microns), $BV_{cbo} = 28$ volts.

Starting with 40$\Omega$/cm material, a conventional transistor measured $BV_{cbo} = 220$ volts; the same geometry and procedures with a high voltage diffusion yielded a device with $BV_{cbo} = 800$ volts.

Repeating the above procedure with 80Ω/cm starting material raised $BV_{cbo}$ to 900 volts in preliminary experiments.

In all of the foregoing examples, other device properties were not affected. Gain and frequency are controlled by the normal base and emitter diffusions and the high voltage diffusion has no effect thereon since the high voltage diffusion can be made equal in depth to the base. Gain factors ranged from 20 to 250 depending on the device. The gain bandwidth product ($f_i$) ranged from 30 to 300 Mhz. The capacitance per unit area is unaffected since it is generally a function of resistivity on the lightly doped side.

Various changes in the details, steps, materials and arrangements of parts, which have been herein described and illustrated to explain the nature of the invention, may be made by those skilled in the art within the principle and scope of the invention as defined in the appended claims.

What is claimed is:

1. A PN junction extending to a major surface of a body of semiconductive material in a diffused, planar semiconductive device of a first conductivity type comprising:
   a first diffused zone of opposite conductivity type and forming said junction at its periphery;
   a second diffused zone of opposite conductivity type entirely surrounded on said surface by said first zone;
   said first zone having a concentration of opposite conductivity impurities of from two to four orders of magnitude less than said second zone and less than about $10^{16}$ atoms cc;
   said body of semiconductive material containing less than about $10^{15}$ atoms/cc of first conductivity type impurities.

2. A PN junction as claimed in claim 1, wherein the bulk concentration of first conductivity type impurities in said material is $10^{13} - 10^{15}$ atoms/cc, the surface concentration of impurities of said opposite conductivity type in said first zone is $10^{14} - 10^{16}$ atoms/cc, and the surface concentration of impurities of said opposite conductivity type in said second zone is $10^{17} - 10^{20}$ atoms/cc.

3. A PN junction as claimed in claim 1, wherein said first zone extends beyond said second zone around the periphery on said surface by a distance of between 0.2 mils and 1 mil.

4. A diffused, planar semiconductive device of improved breakdown voltage comprising:
   a semiconductive body having two major surfaces separated by edges and including impurities of a first conductivity type;
   a region of opposite conductivity type impurities within said body and establishing a PN junction extending to a major surface of said body, said region comprising a first diffused zone and a second diffused zone;
   said first zone forming said junction at its periphery and containing less than about $10^{16}$ atoms/cc of said opposite conductivity type impurities;
   said second zone being entirely surrounded on said surface and within said body by said first zone, and having an average concentration of said opposite conductivity-type impurities of from two to four orders of magnitude higher than said first zone;
   said semiconductive body containing less than about $10^{15}$ atoms/cc of first conductivity type impurities.

5. A semiconductive device as claimed in claim 4, wherein the bulk concentration of first conductivity type impurities in said material is $10^{13} - 10^{15}$ atoms/cc, the average surface concentration of impurities of said opposite conductivity type in said first zone is $10^{14} - 10^{16}$ atoms/cc, and the average surface concentration of impurities of said opposite conductivity type in said second zone is $10^{17} - 10^{20}$ atoms/cc.

6. A semiconductive device as claimed in claim 4, wherein said first zone extends beyond said second zone around the periphery on said surface by a distance of between 0.2 mils and 1 mil.

7. The semiconductive device as claimed in claim 4, wherein said first and second zones comprise a base, said semiconductive body comprises a collector, and additionally comprising an emitter region of said first conductivity type within said base.

8. The semiconductive device as claimed in claim 4, and additionally comprising an oxide film on said surface and a pair of electrical ohmic contacts overlying said film and connecting conductors to the two sides of said junction.

9. The semiconductive device as claimed in claim 4, wherein said second zone is elongated, and additionally comprising a pair of electrical contacts connecting conductors to the opposite ends of said second zone, said second zone forming a resistive element.

10. The semiconductive device as claimed in claim 4, and additionally comprising a passivating oxide film on at least a portion of said surface and covering said junction.

11. A semiconductive device as claimed in claim 8, wherein said first zone extends to the edge of said body in at least the area beneath one said lead.

12. A high voltage, planar, diffused transistor comprising:
   a body of semiconductive material having two major surfaces separated by edges and including less than about $10^{15}$ atoms/cc of impurities of a first conductivity type forming a collector region;
   a base region of opposite conductivity type impurities within said body and establishing a first planar PN junction extending to a surface of said body, said region comprising a first diffused zone and a second diffused zone;
   said first zone forming said junction at its periphery;
   said second zone being entirely surrounded on said surface and within said body by said first zone;
   said first zone having a surface concentration of said opposite conductivity type impurities of from two to four orders of magnitude less than said second zone and less than about $10^{16}$ atoms/cc;
   an emitter region of said first conductivity type diffused within said second zone and establishing a second planar PN junction extending to said surface of said body; and
   a passivating oxide film on said surface and at least covering said junctions.

13. A transistor as claimed in claim 12, wherein the bulk concentration of first conductivity type impurities in said material is $10^{13} - 10^{15}$ atoms/cc, the surface concentration of impurities of said opposite conductivity type in said first zone is $10^{14} - 10^{16}$ atoms per cubic centimeter, and the surface concentration of impurities of said opposite conductivity type in said second zone is $10^{17} - 10^{20}$ atoms per cubic centimeter.

14. A transistor as claimed in claim 12, wherein said first zone extends beyond said second zone around the periphery on said surface by a distance of between 0.2 mils and 1 mil.

15. A transistor as claimed in claim 12, and additionally comprising:
a first conductor overlying said oxide film and contacting said base region;
a second conductor overlying said oxide film and contacting said emitter region; and
a third conductor contacting said collector region.

16. The transistor as claimed in claim 15, wherein said first junction extends to the edge of said body in at least the area beneath said base and emitter conductors.

17. In a diffused semiconductive device including a plurality of active devices in a body of semiconductive material of one conductivity type and isolated from each other by first diffused zones of opposite conductivity type extending through said body and forming a pair of PN junctions, and further including a passivating oxide film on a surface of said body covering at least said junctions, the improvement comprising:
second diffused zones of said opposite conductivity type surrounding said first zones adjacent to said oxide film on said surface, said second zones having an average concentration of said opposite conductivity impurities of from two to four orders of magnitude less than said first zones and less than about $10^{16}$ atoms/cc;
said body of semiconductive material containing no more than about $10^{15}$ atoms/cc of first conductivity type impurities.

18. In a dielectrically isolated planar integrated circuit including a plurality of active and passive semiconductive devices in discrete bodies of single crystal semiconductive material of one conductivity type, said bodies being spaced from each other and embedded in a matrix selected from the group consisting of polycrystalline and amorphous materials and having an insulating oxide coating adjacent said matrix material, said devices including first diffused zones of opposite conductivity type forming PN junctions reaching an exposed major surface of said bodies, the improvement comprising:
second diffused zones of said opposite conductivity type surrounding said first zones on said surface, and within said body, said second zones having a surface concentration of opposite conductivity impurities of from two to four orders of magnitude less than said first zones and less than about $10^{16}$ atoms/cc;
said bodies of semiconductive material containing no more than about $10^{15}$ atoms/cc of first conductivity type impurities.

19. A diffused planar, high frequency transistor of improved saturation characteristics comprising:
a body of semiconductive material having less than about $10^{15}$ atoms/cc of first conductivity type impurities and forming a collector region;
a base region of opposite conductivity impurities forming a collector-base PN junction at its periphery, said junction extending to a major surface of said body and comprising a diffused first zone and a diffused second zone;
said first zone entirely surrounded said second zone on said surface but being of equal depth;
said first zone having a concentration of opposite conductivity impurities of from two to four orders of magnitude less than said second zone and less than about $10^{16}$ atoms/cc; and
an emitter region of first conductivity impurities deeply diffused within said base region and forming an emitter-base PN junction at its periphery, said emitter-base junction also extending to said surface and entirely surrounded thereon by said second zone.

20. A PN junction in a planar, dielectrically-isolated semiconductive device, said device having material of a first conductivity type dielectrically isolated from neighboring devices by a surrounding oxide layer and having on a major surface an oxide layer and at least two overlying metallic leads connected to said device, said junction comprising:
a first zone of opposite conductivity type material, the boundaries of said zone defining said junction within said device, said first zone additionally extending to said surrounding oxide layer in the area beneath one said lead;
a second zone of opposite conductivity type entirely surrounded on said surface and within said material by said first zone;
said first zone having a concentration of opposite conductivity impurities of from two to four orders of magnitude less than said second zone, but no more than about $10^{16}$ atoms/cc.

21. A PN junction as claimed in claim 20, wherein the bulk concentration of first conductivity type impurities in said material is $10^{13} - 10^{15}$ atoms/cc, the surface concentration of impurities of said opposite conductivity type in said first zone within said device of $10^{14} - 10^{16}$ atoms/cc, and the surface concentration of impurities of said opposite conductivity type in said second zone is $10^{17} - 10^{20}$ atoms/cc.

22. A diffused, planar, dielectrically isolated semiconductive device of improved breakdown voltage and operating characteristics comprising:
a semiconductive body including less than about $10^{15}$ atoms/cc of impurities of a first conductivity type; said body being isolated from neighboring bodies by dielectric material including an oxide layer;
an oxide coating overlying a major surface of said body;
a region of opposite conductivity type impurities within said body and establishing a PN junction reaching said surface, said region comprising a diffused first zone and a diffused second zone;
a metallic lead penetrating said coating connecting said second zone into a circuit;
said first zone having boundaries defining said junction within said body and additionally extending to said oxide layer in the area beneath said lead;
said first zone having a concentration of opposite conductivity impurities of less than about $10^{16}$ atoms/cc;
said second zone being entirely surrounded on said surface by said first zone, and having an average concentration of said opposite conductivity type impurities of from two to four orders of magnitude higher than said first zone.

23. A semiconductive device as claimed in claim 22, wherein the bulk concentration of first conductivity type impurities in said material is $10^{13} - 10^{15}$ atoms/cc, the surface concentration of impurities of said opposite conductivity type in said first zone within said device is $10^{14} - 10^{16}$ atoms/cc, and the surface concentration of impurities of said opposite conductivity type in said second zone is $10^{17} - 10^{20}$ atoms/cc.

24. A semiconductive device as claimed in claim 22, wherein said first zone extends beyond said second zone on said surface by a distance of at least 0.2 mils.

25. The semiconductive device as claimed in claim 22, wherein said region comprises a base having said lead connected thereto, said semiconductive body comprises a collector, and additionally comprising:
- an emitter region of said first conductivity type within said base;
- a second lead overlying said oxide and connected to said emitter region;
- said first zone extending to said oxide layer in the area beneath both said base and emitter leads; and
- a third lead connected to said collector.

* * * * *

UNITED STATES PATENT AND TRADEMARK OFFICE
CERTIFICATE OF CORRECTION

PATENT NO. : 4,074,293
DATED : 14 February 1978
INVENTOR(S) : Bernard L. Kravitz It is certified that error appears in the above-identified patent and that said Letters Patent are hereby corrected as shown below:

IN THE CAPTION:

Item [56], References Cited, under "Other Publications"

add: -- R. Denning et al, Epitaxial $\pi$-$\nu$ n-p-n High Voltage Power Transistors, IEEE Trans. on Electron Devices, Vol. ED-17, No. 9, Sept. 1970, pp. 711-716. --

Col. 6, line 49: Delete "U.S."

*Signed and Sealed this*

*Fourth* Day of *July 1978*

[SEAL]

*Attest:*

RUTH C. MASON
*Attesting Officer*

DONALD W. BANNER
*Commissioner of Patents and Trademarks*